United States Patent [19]
Thompson

[11] Patent Number: 5,928,313
[45] Date of Patent: Jul. 27, 1999

[54] METHOD AND APPARATUS FOR SAMPLE RATE CONVERSION

[75] Inventor: Laurence A. Thompson, Saratoga, Calif.

[73] Assignee: Apple Computer, Inc., Cupertino, Calif.

[21] Appl. No.: 08/841,891

[22] Filed: May 5, 1997

[51] Int. Cl.$^6$ .............................. G06F 17/17; G06F 17/10
[52] U.S. Cl. ........................................... 708/313; 708/314
[58] Field of Search ............................. 364/724.1, 724.16

[56] References Cited

U.S. PATENT DOCUMENTS

| | | | |
|---|---|---|---|
| 5,335,194 | 8/1994 | Clayton et al. ........................ | 364/724.1 |
| 5,528,527 | 6/1996 | Iwata ..................................... | 364/724.1 |
| 5,621,404 | 4/1997 | Heiss et al. ........................... | 364/724.1 |

Primary Examiner—Tan V. Mai
Attorney, Agent, or Firm—Beyer & Weaver, LLP

[57] ABSTRACT

An improved apparatus and method for performing sample rate conversion of digital sample values is disclosed. The sample rate conversion utilizes a finite impulse response filter that substantially eliminates the introduction of phase errors that plague conventional approaches. The computations required to implement the finite impulse response filter are provided in a hardware implementation that is efficiently constructed and utilized so as to be practical to implement in hardware as well as being fast enough to process the incoming samples in essentially real time. The digital sample values being processed by the invention can, for example, be audio, video or graphics related digital sample values. The sample rate conversion is suitable for scaling the size of the images (graphical or video) along one or more axes, or for time compression or expansion of an audio streaming rate.

20 Claims, 6 Drawing Sheets

METHOD AND APPARATUS FOR SAMPLE RATE CONVERSION

BACKGROUND OF THE INVENTION

1. Field of the Invention

The present invention relates to digital sample rate conversion and, more particularly, to image scaling using sample rate conversion.

2. Description of the Related Art

It is known that true scaling of images is computationally complex. Due to such complexities, conventional video graphics boards supporting scaling perform some simplified approach to scaling video images. Although the simplified approaches are significantly easier to implement, the resulting image quality is often unsatisfactory because the simplified approaches introduce undesired artifacts into the video images being scaled.

Conventional techniques for scaling video images primarily utilize either a pixel dropping technique or a linear interpolation technique. Both of these techniques are suitable for scaling images down but are not suitable for enlarging images.

In the pixel dropping technique, in order to scale down a video image, a digital sample value corresponding to a pixel will be periodically dropped. It is believed that most commercially available video graphics chips used in personal computers use the pixel dropping technique. A slightly improved approach to pixel dropping operates to low pass filter the incoming digital samples prior to pixel dropping. The low pass filtering operates to remove some of the high frequencies in the digital samples prior to the pixel dropping so as to reduce the undesirable artifacts. Commercially available personal computers from Apple Computer, Inc. of Cupertino, Calif., namely the PowerMac 7600 and 8500 series, included a video graphics board with an integrated circuit chip (Philips SAA7196) that was capable of scaling down video images used the pixel dropping approach with low pass filtering. In any event, both of these conventional techniques produce unwanted artifacts into the video images. These artifacts result from the introduction of high frequencies into the images as well as the introduction of phase errors.

Another conventional approach to scaling video images uses a linear interpolation technique. According to the linear interpolation approach, multipliers are used to calculate sample values that lie in arbitrary distance between two source sample values. The linear interpolation technique also introduces unwanted high frequencies and phase errors, but the extent to which they are introduced is reduced compared to the other previously mentioned conventional approaches due to the interpolation being performed.

Thus, there is a need for an improved technique for scaling images either up or down without introducing undesirable high frequencies or phase errors, so that the resulting scaled images are substantially free from artifacts.

SUMMARY OF THE INVENTION

Broadly speaking, the invention is a technique for performing sample rate conversion of digital sample values. The sample rate conversion technique according to the invention utilizes a finite impulse response filter that substantially eliminates the introduction of phase errors that plague conventional approaches. The computations required to implement the finite impulse response filter are provided in a hardware implementation that is efficiently constructed and utilized so as to be practical to implement in hardware as well as being fast enough to process the incoming samples in essentially real time. The digital sample values being processed by the invention can, for example, be audio, video or graphics related digital sample values. In the case of video or graphics, the digital sample values pertain to an image or series of images and the sample rate conversion provided by the invention is suitable for scaling the size of the images along one or more axes. The scaled images produced by the inventive technique are substantially free from artifacts. In the case of audio, the sample rate conversion provided by the invention is suitable for time compression or expansion of an audio streaming rate.

The invention can be implemented in numerous ways, including as an apparatus or a method. Several embodiments of the invention are described below.

As an apparatus for performing sample rate conversion, an embodiment of the invention includes: a plurality of storage devices arranged in a serial chain, the storage devices being capable of storing an input sample value for a series of samples, the series of samples being sequentially shifted through each of the storage devices in the serial chain in accordance with a clock signal; a coefficient memory storage for storing a plurality of coefficient sets, each of the coefficient sets includes a plurality of coefficient values; a plurality of multipliers, each of the multipliers being associated with one of the storage devices, each of the multipliers operates to multiply the respective sample value stored in the respective one of the storage devices with a respective coefficient value of one of the coefficient sets to produce a partial output value; an adder for adding the partial output values from each of the multipliers to produce an output sample value; and a controller for producing the clock signal to receive the input sample values and for selecting one of the coefficient sets from the coefficient memory storage to supply to the multipliers for the producing of each of the partial output values. The input sample values can, for example, pertain to a graphical image, a video image or a stream of audio data.

As a sample rate conversion apparatus for scaling input sampled data in accordance with a scaling ratio L/M, where L and M are integers, an embodiment of the invention includes: a finite impulse response (FIR) filter including a fixed number (X) of multipliers, the FIR filter having N filter taps, where the number of filter taps N=LX, the FIR filter operates on the input sampled data in accordance with the scaling ratio L/M to produce output sampled data; and a coefficient storage device for storing a plurality of coefficient sets, each of the coefficient sets having a filter coefficient for each of the X multipliers.

As a method for scaling an image to a larger size or a smaller size, an embodiment of the invention includes the operations of: receiving a sequence of a predetermined number of input samples for an image; receiving a scaling ratio, the scaling ratio being a ratio of integers; determining an output sampling rate based on the scaling ratio; determining a series of coefficients sets having the predetermined number of coefficients; supplying the coefficients of one of the coefficient sets to the predetermined number of multipliers; multiplying the respective coefficients and input samples to produce the predetermined number of partial output values; summing the predetermined number of the partial output values to determine an output sample value; receiving a next input sample for the image and modifying the sequence of the input samples to add the next input sample and drop an oldest one of the input samples; and repeating the operations beginning with the determining of the series of coefficient sets after receiving the next input sample.

The advantages of the invention are numerous. One advantage of the invention is that very minimal high frequency or phase errors are introduced by the sample rate conversion (scaling) technique utilized by the invention. Since the sample rate conversion technique utilizes a multirate finite impulse response (FIR) filter approach, the needed sample values (i.e., pixels) are calculated with a high degree of accuracy so as to minimize any phase errors and likewise reducing the introduction of undesirable high frequencies. Another advantage of the invention is that the basic technique is scalcable in accordance with the amount of hardware resources made available for providing the scaling function. Yet another advantage of the invention is that the sample rate conversion (scaling) technique according to the invention can use different quality settings for horizontal and vertical scaling directions. Still another advantage of the invention is that the invention is applicable to sampled data generally, including video images, graphical images and audio streams.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1:
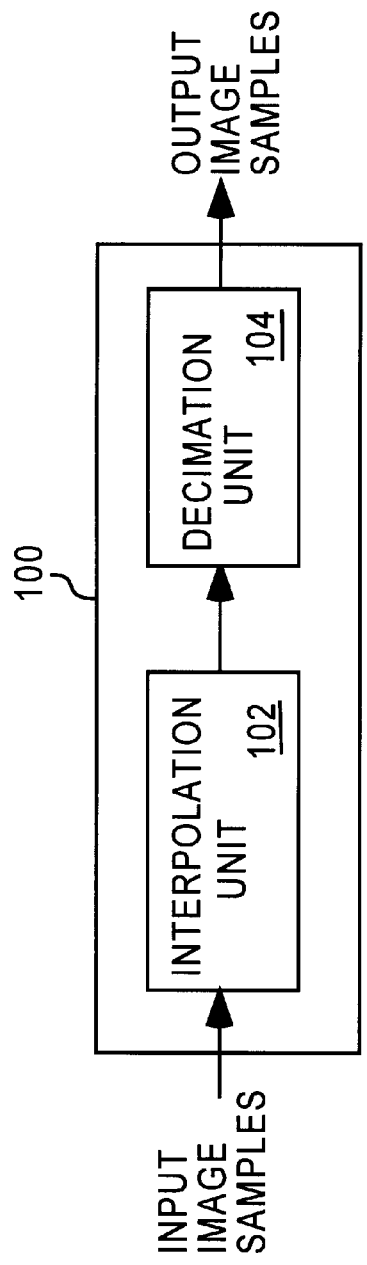
FIG. 1 is a conceptual diagram of a multirate filter according to an embodiment of the invention.

The invention relates to a technique for performing sample rate conversion of digital sample values. The sample rate conversion technique according to the invention utilizes a finite impulse response filter that substantially eliminates the introduction of phase errors that plague conventional approaches. The computations required to implement the finite impulse response filter are provided in a hardware implementation that is efficiently constructed and utilized so as to be practical to implement in hardware as well as being fast enough to process the incoming samples in essentially real time.

The digital sample values being processed by the invention can, for example, be audio, video or graphics related digital sample values. In the case of video or graphics, the digital sample values pertain to an image or series of images and the sample rate conversion provided by the invention is suitable for scaling the size of the images along one or more axes. The scaled images produced by the inventive technique are substantially free from artifacts. In the case of audio, the sample rate conversion provided by the invention is suitable for time compression or expansion of an audio streaming rate.

It is very common to have a need to scale video images. For example, when attempting to fit an image into a user defined window on a computer screen, there is a need to scale the video image to fit the window. Another reason for scaling video image is to provide sample rate conversion. In the computer graphics world, the square pixel has evolved and the digital video industry has standardized on a rectangular aspect ratio. Hence, when providing digital video on a computer graphics device it is commonly necessary to convert from one sampling rate to another sampling rate which requires, for example, scaling by ratios such as 8/9 or 15/16. The scaling technique according to the invention is able to achieve these scaling ratios and many others while requiring only a reasonable amount of hardware resources, yet still providing significant performance and high quality images expected by discerning consumers.

It is also very common to have a need to scale graphical images. More particularly, there is obtain a need to scale graphical images such that they fit on computer display screens having different resolutions. For example, the scaling technique according to the invention might be used to scale a 640×480 image to fit on a 1024×768 display screen.

The concepts of sampling and sample rate conversion are well known concepts of digital signal processing. The process of digitally converting a signal of one sample rate to a different sampling rate is called sample rate conversion. When the new sampling rate is higher than the original sampling rate, the process is generally referred to as interpolation, whereas when the new sampling rate is less than the original sampling rate, the process is generally known as decimation. In a technical book "Multirate Digital Signal Processing," by Ronald E. Crochiere and Lawrence R. Rabiner, Prentice-Hall, Inc. (1982), sample rate conversion and techniques for realizing sampling rate conversion using multirate FIR filters are described, and this book is hereby incorporated by reference in its entirety.

Embodiments of the invention are discussed below with reference to FIGS. 1–7B. However, those skilled in the art will readily appreciate that the detailed description given herein with respect to these figures is for explanatory purposes as the invention extends beyond these limited embodiments.

FIG. 1 is a conceptual diagram of a multirate filter 100 according to an embodiment of the invention. The multirate filter 100 receives input image samples at a first sample rate and produces output image samples at a second sample rate. The second sample rate differs from the first scaling rate by a scaling ratio (SR).

The multirate filter 100 includes an interpolation unit 102 and a decimation unit 104. The multirate filter 100 receives the input image samples to be scaled at the interpolation unit 102. The interpolation unit 102 is provided to increase the sample rate of the input image samples. For example, if the input image samples are received at a frequency $f_{in}$, the interpolation unit 102 operates to increase the sample rate by an integer amount (L). Hence, the increased sample rate $(L \cdot f_{in})$ at the output of the interpolation unit 102 is supplied to the decimation unit 104. The decimation unit 104 operates to decrease the sample rate $(L \cdot f_{in})$ of the samples it receives from the interpolation unit 102. More particularly, the decimation unit 104 decreases the sample rate of the samples by an integer amount (M). Hence, the output image signals being output from the decimation unit 104 are at an output sample rate $F_{out}=L/M \cdot f_{in}$. Accordingly, the multirate filter 100 operates to scale the input image samples up or down according to a ratio of integers (L/M). For example, the input image samples can be scaled by a ratio of 1/4, 8/9, 15/16, 32/33, 253/178, 639/640 and many others.

Figure 2:
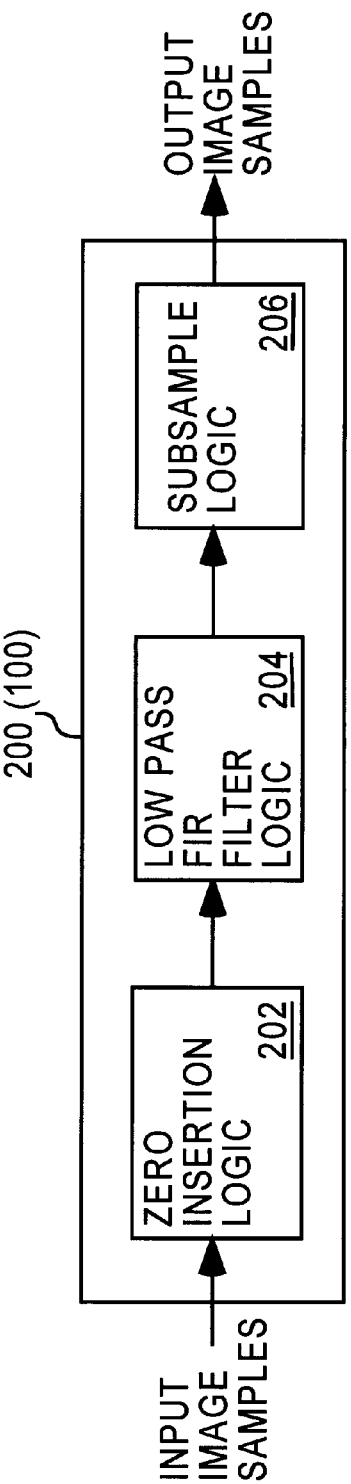
FIG. 2 is a block diagram of a multirate filter according to an embodiment of the invention.

FIG. 2 is a block diagram of a multirate filter 200 according to an embodiment of the invention. The multirate filter 200 is a more detailed diagram of the multirate filter 100 illustrated in FIG. 1.

Although the multirate filter 200 conceptually includes the interpolation unit 102 and the decimation unit 104, the multirate filter 200 includes three major logic blocks. The three major logic blocks are zero insertion logic 202, low pass FIR filter logic 204, and subsample logic 206. The multirate filter 200 receives the input image samples at the zero insertion logic 202. The zero insertion logic 202 operates to insert zeros between the input image samples as needed to increase the sample rate. Normally, to scale up or increase the sample rate by an integer amount L, (L−1) zeros are inserted between each adjacent pair of the input image samples. After increasing the sample rate by the insertion of zeros, the resulting image samples are then low pass filtered by low pass FIR filter logic 204. The low pass FIR filter logic 204 operates to remove high frequency components from the image samples that were introduced due to the zero insertion logic 202. The low pass FIR filter logic 204 performs the low pass filtering conceptually required by either the interpolation unit 102 or the decimation unit 104 so as to remove high frequencies that would otherwise lead to artifacts in the final scaled image. When scaling up (i.e., L>M), the cutoff frequency ($f_c$) for the low pass filtering is equal to 1/2 L as the interpolation unit 102 controls the cutoff frequency ($f_c$) Alternatively, when scaling down (i.e., M>L), the cutoff frequency ($f_c$) for the low pass filtering is equal to 1/2M as the decimation unit 104 controls the cutoff frequency ($f_c$). Since the low pass FIR filter logic 204 uses a finite impulse response (FIR) filter, little or no phase errors are introduced into the image. Coefficients for the finite impulse response (FIR) filter are preferably pre-multiplied by the integer amount (L) to adjust the average energy level for the (L−1) zeros that are inserted.

The image samples being output by the filter logic 204 are supplied to the subsample logic 206. The subsample logic 206 operates to decrease the sample rate of the image samples. Normally, to scale down or decrease the sample rate by an integer amount M, every $M^{th}$ sample from the image samples supplied by the filter logic 204 is output from the subsample logic 206 as one of the output image samples. The result is that the input image is scaled by the ratio of integers L/M to achieve the output image samples at a sample rate $F_{out}$ as desired.

Figure 3:
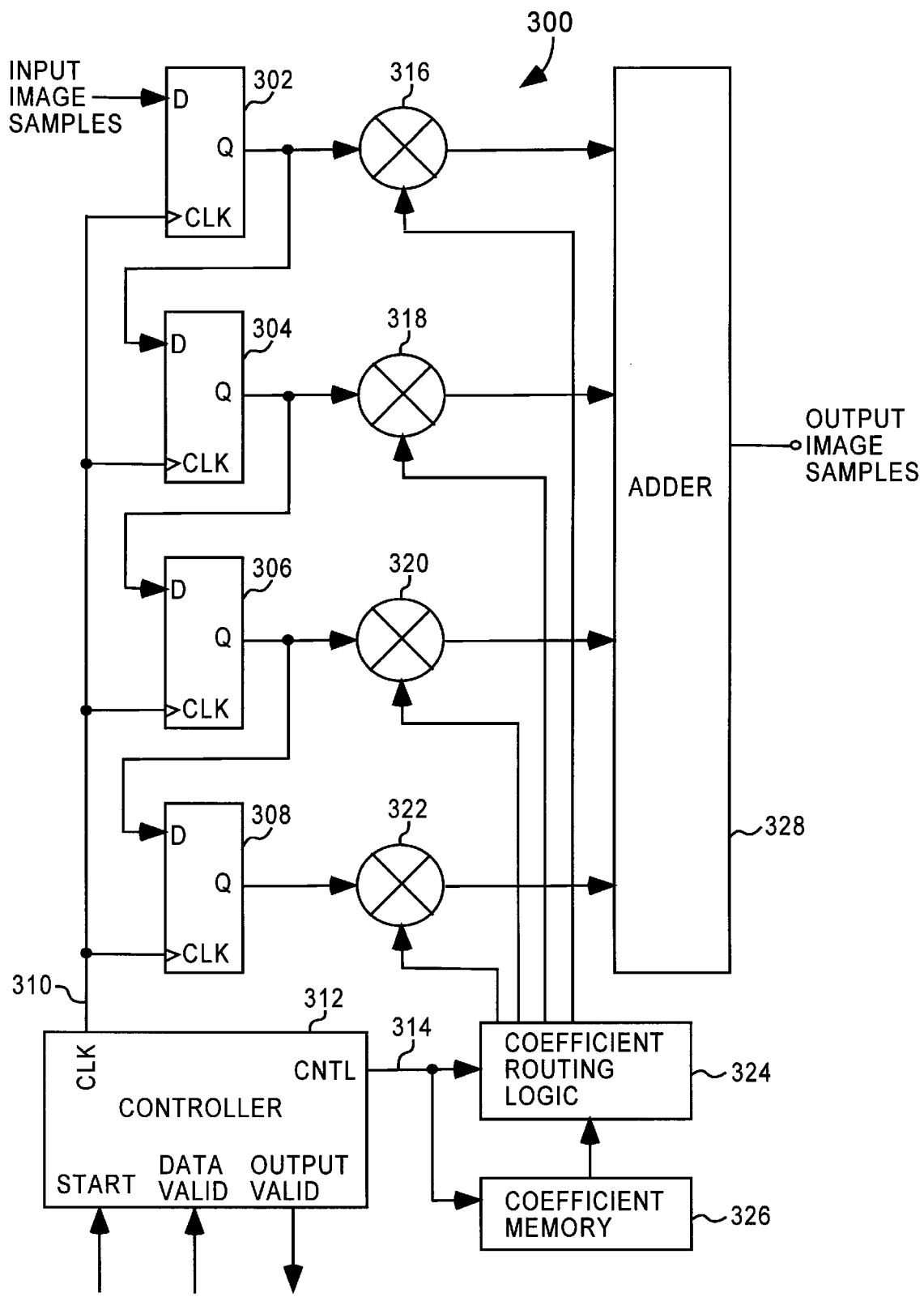
FIG. 3 is a block diagram of a multirate filter according to a first embodiment of the invention.

FIG. 3 is a block diagram of a multirate filter 300 according to a first embodiment of the invention. The hardware implementation for the multirate filter 300 according to the first embodiment is designed so as to efficiently use hardware resources and avoid unnecessary operations.

The multirate filter 300 includes a fixed number of multiplier circuits that are used to produce output image samples with an altered sample rate. The sample rate of the output image samples is a ratio of integers (L/M) multiplied by the sample rate of the input image samples; hence, the resulting sample rate of the output image samples $F_{out}$ is $L/M \cdot f_{in}$. The ratio of integers is suitable over a large range of such ratios even though the number of multipliers in the multirate filter 300 is fixed. The construction of the multirate filter 300 is described in more detail as follows.

The multirate filter 300 includes a series of latches 302, 304, 306 and 308. The first latch 302 receives the input image samples in sequential fashion as its data input terminal (D) in accordance with a clock signal 310. The clock signal 310 is received by a clock input terminal of each of the latches 302, 304, 306 and 308. Each subsequent input image sample that is received by the first latch 302 causes the three previous input image sample values to respectively progress to the next latch in the chain of latches 304, 306 and 308 in accordance with the clock signal 310.

In addition, the multirate filter 300 includes a controller 312. The controller 312 controls the overall operation of the multirate filter 300 using various signals. The controller 312 receives a start signal and a data valid signal, and produces the clock signal 310, an output valid signal and control signals 314. The operation of the controller 312 is described in more detail below with reference to FIGS. 4–6.

The multirate filter 300 also includes multipliers 316, 318, 320 and 322. In addition, the multirate filter 300 includes coefficient routing logic 324, a coefficient memory 326 and an adder 328. The coefficient routing logic 324 receives the control signals from the controller 312 and receives an appropriate coefficient set from the coefficient memory 326. The particular coefficient set is selected from a plurality of coefficient sets stored in the coefficient memory 326 in accordance with the control signals 314. Each coefficient set includes a coefficient for each of the multipliers 316, 318, 320 and 322. The coefficient routing logic 324 operates to route each of the coefficients within a particular coefficient set to the appropriate multiplier 316, 318, 320 and 322. The multiplier 316 multiplies the output of the latch 302 with a first coefficient to produce a first partial output value. The second multiplier 318 operates to multiply the output of the second latch 304 with a second coefficient to produce a second partial output value. The third multiplier 320 operates to multiply the output of the third latch 306 with a third coefficient to produce a third partial output value. A fourth multiplier 322 operates to multiply the output of the latch 308 with a fourth coefficient to produce a fourth partial output value. The adder 328 operates to add the first through fourth partial output values together to produce an output image sample. The output image samples are output from the adder 328 at a sampling rate $F_{out}$ that differs from the sampling rate $F_{in}$ of the input image samples by the ratio of integers (L/M).

Figure 4:
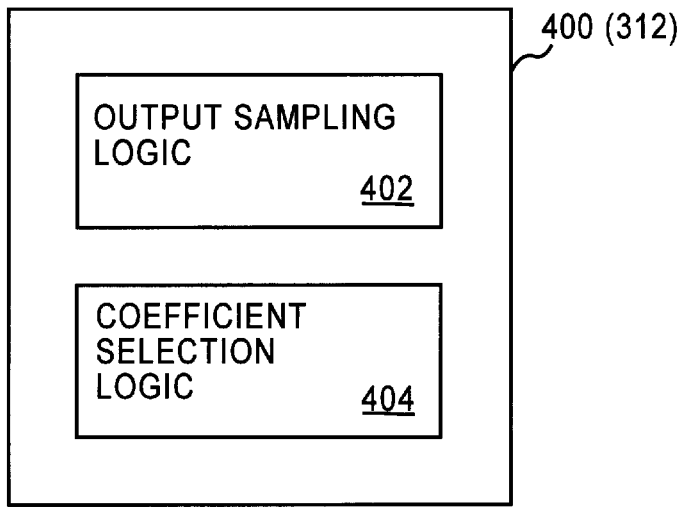
FIG. 4 is a block diagram of a controller according to an embodiment of the invention.

FIG. 4 is a block diagram of a controller 400 according to an embodiment of the invention. The controller 400 is an embodiment of the controller 312 illustrated in FIG. 3. The controller 400 operates to control the operation of the multirate filter 300. More particularly, the controller 400 includes output sampling logic 402 and coefficient selection logic 404. The output sampling logic 402 operates to control when the output image samples are output by the multirate filter 300. The output sampling logic 402 also produces the control signals 314 that are utilized by the coefficient routing logic 324 to route the particular coefficients of a selected set of coefficients to the appropriate multipliers 316, 318, 320 and 322. The coefficient selection logic 404 operates to select the appropriate coefficient set from the various coefficient sets stored within the coefficient memory 326. The coefficient selection logic 404 also produces some of the control signals 314 that are supplied to the coefficient memory 326 for selection of the appropriate coefficient set.

Figure 5:
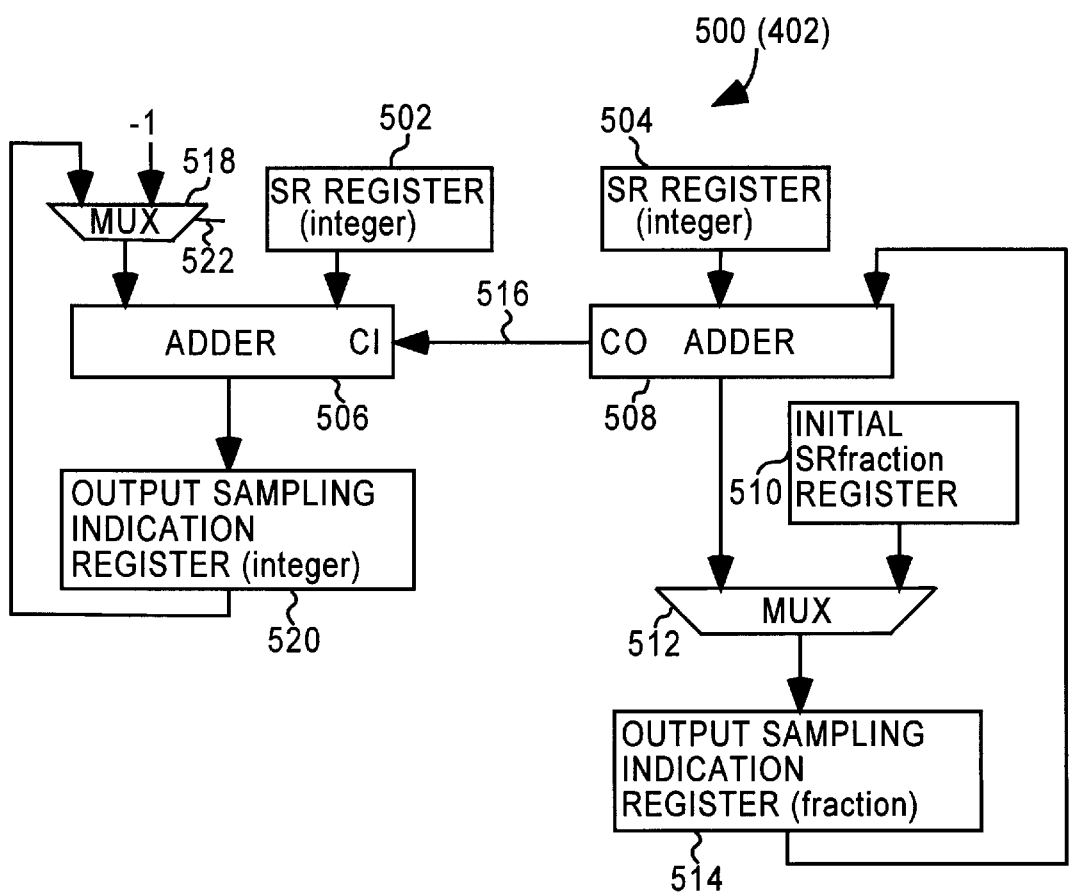
FIG. 5 is a block diagram of output sampling logic according to an embodiment of the invention.

FIG. 5 is a block diagram of output sampling logic 500 according to an embodiment of the invention. The output sampling logic 500 is an exemplary implementation of the output sampling logic 402 illustrated in FIG. 4.

The output sampling logic 500 includes scaling ratio (SR) storage registers 502 and 504. The scaling ratio (SR) register 502 stores an integer portion of the scaling ratio. The scaling ratio (SR) register 504 stores the fractional portion of the scaling ratio. For example, if the scaling ratio, defined as L/M, is 3/4 which equals 0.11, then the scaling ratio integer portion stored in the scaling ratio register 502 would be equal to "0000", and the scaling ratio fractional portion stored in the scaling ratio register 504 would be "110000000000", assuming the scaling ratio register 502 stores four (4) bits and the scaling ratio register 504 stores twelve (12) bits.

The outputs of the scaling ratio registers 502 and 504 are respectively supplied to adders 506 and 508. The output sampling logic 500 also includes an initial scaling ratio register 510 that stores an initial fractional value that is utilized to initialize a scaling sequence. Preferably, the initial fractional value stored in the initial scaling ratio register 510 is zero (0). The output of the adder 508 and the output of the initial scaling ratio register 510 are supplied to a multiplexer 512. During the initialization of the output sampling logic 500 for a scaling operation, the multiplexer 512 selects the output of the initial scaling ratio register 510 as the output of the multiplexer 512; otherwise, at all other times the multiplexer 512 selects the output from the adder 508 as the output of the multiplexer 512. In any case, the output of the multiplexer 512 is supplied to an output sampling indication register 514. The output sampling indication register 514 stores a fractional amount associated with an indicator that is used to determine when to generate an output image sample. The value stored in the output sampling indication register 514 is supplied as another input (addend) to the adder 508 as illustrated in FIG. 5.

When the adder 508 adds the fractional portion of the scaling ratio from the scaling ratio register 504 with the fractional portion of the output sampling indication from the register 514, a sum value and a carry-out signal 516 are produced. The sum value is supplied to the multiplexer 512 as previously mentioned, and the carry-out signal 516 is supplied to a carry input terminal of the adder 506. When the carry-out signal 516 indicates a carry-out has occurred, the output of the adder 506 is normally incremented by one. The output from the adder 506 is stored in an output sampling indication register 520. The output sampling indication register 520 stores an integer portion of the output sampling indicator that serves to indicate when an output image sample is to be output from the multirate filter 300. The value stored in the output sampling indication register 520 is also supplied to a multiplexer 518 which receives as its other input a minus one (−1) value. The output of the multiplexer 518 is normally selected by a control signal 522 to be the value provided by the output sampling indication register 520. However, the multiplexer 518 outputs the minus one (−1) value in accordance with the control signal 522 when an output image sample has just been output.

Figure 6:
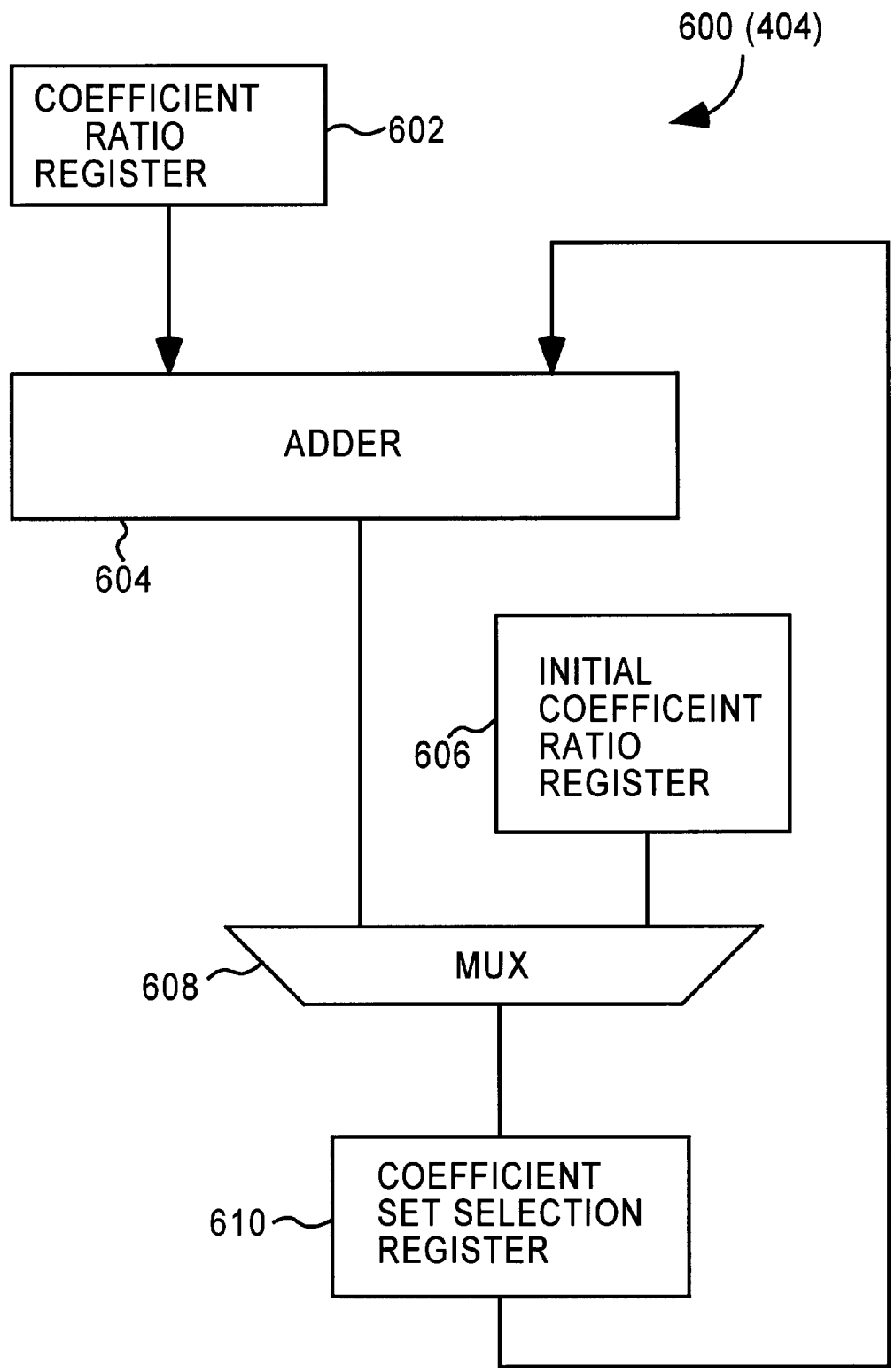
FIG. 6 is a block diagram of a coefficient selection apparatus according to an embodiment of the invention.

FIG. 6 is a block diagram of a coefficient selection apparatus 600 according to an embodiment of the invention. The coefficient selection apparatus 600 is an exemplary embodiment of the coefficient selection logic 404 illustrated in FIG. 4.

The coefficient selection apparatus 600 includes a coefficient ratio register 602 that stores a coefficient ratio value. The coefficient ratio value is supplied to an adder 604 by the coefficient ratio register 602. Preferably, the coefficient ratio value is a ratio of integers (M/L) (which is the inverse of the scaling ratio). The output of the adder 604 is supplied along with a value stored in an initial coefficient ratio register 606 to a multiplexer 608. The value stored in the initial coefficient ratio register 606 is an initial value utilized to obtain the initial (first) coefficient set from the coefficient memory 326. The multiplexer 608 selects the value from the initial coefficient ratio register 606 during initialization to obtain the first coefficient set, and thereafter, selects the output from the adder 604 to obtain the subsequent coefficient sets. The output of the multiplexer 608 is stored in a coefficient set selection register 610. More particularly, the value stored in the coefficient selection register 610 is a fractional portion of the output of the multiplexer 608. Thus, the value stored in the coefficient set selection register 610 is utilized to select the appropriate coefficient set from the coefficient memory 326. The value stored in the coefficient set selection register 610 is also supplied as an input to the adder 604 as illustrated in FIG. 6. Hence, the selection of the next subsequent coefficient set is achieved by adding the coefficient ratio value stored in the coefficient ratio register 602 and the value stored in the coefficient set selection register 610.

Figure 7A:
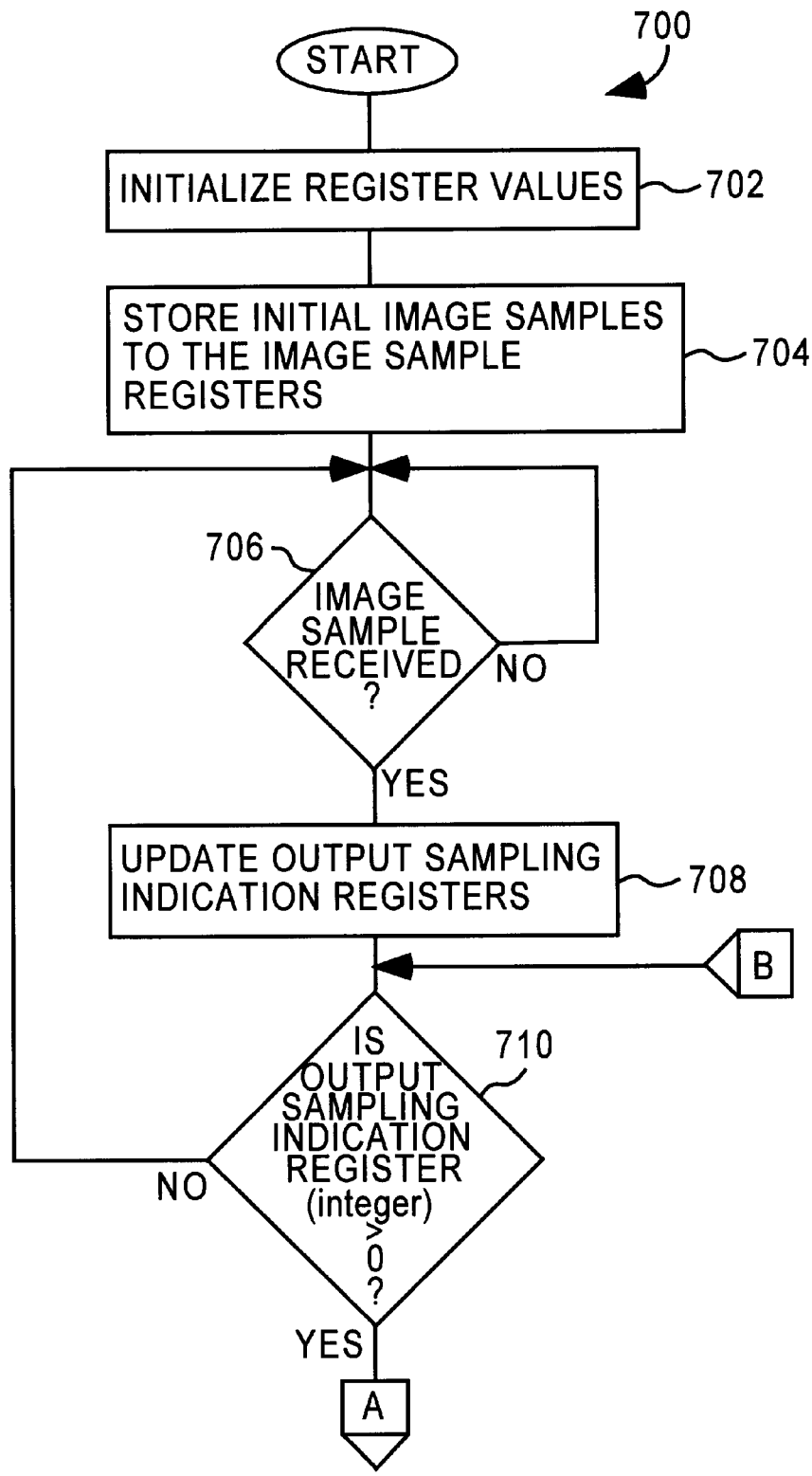
FIGS. 7A and 7B are flow diagrams of image scaling processing according to an embodiment of the invention.
Figure 7B:
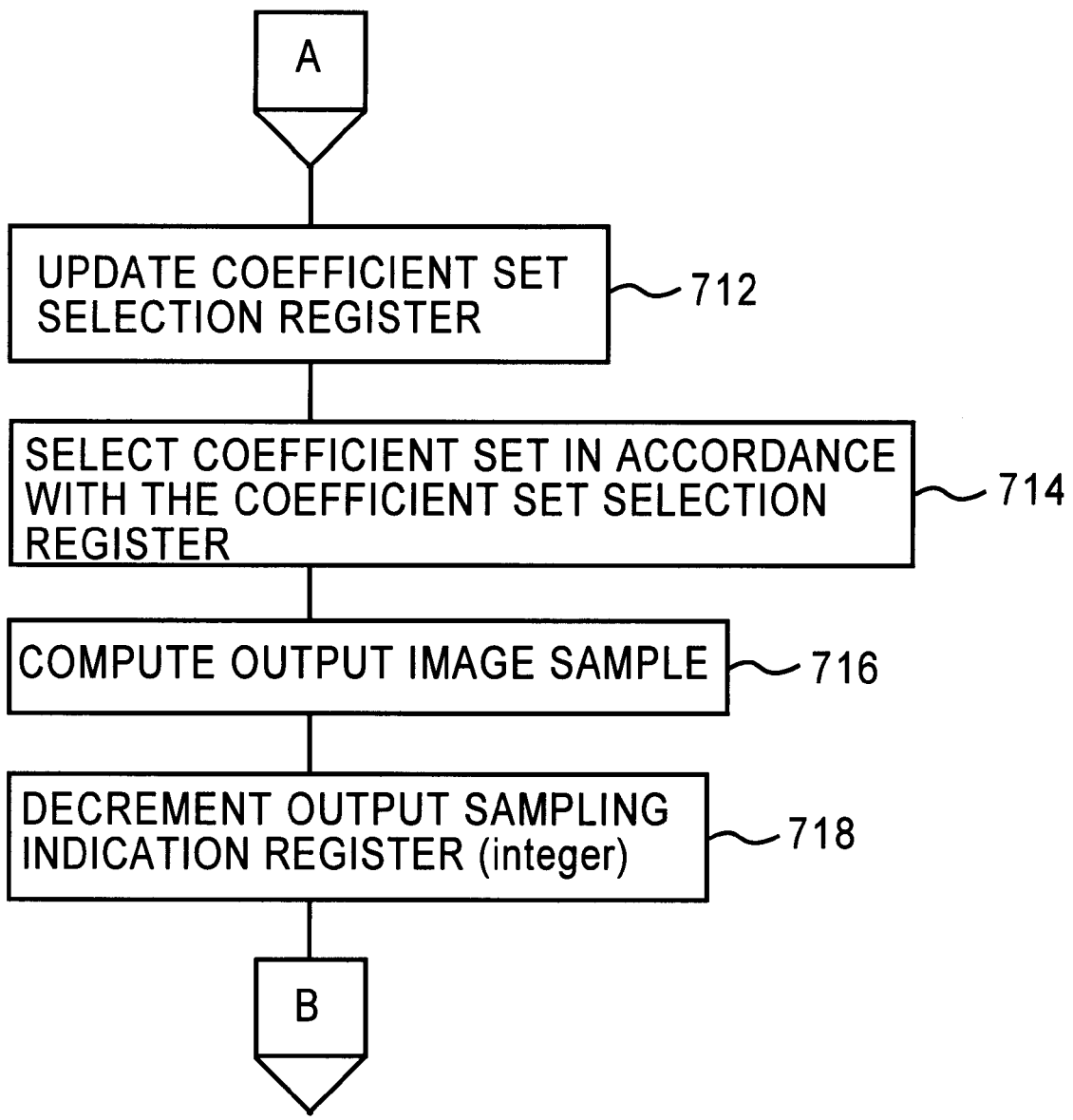

FIGS. 7A and 7B are flow diagrams of image scaling processing 700 according to an embodiment of the invention. The image scaling processing 700 is, for example, performed by the multirate filter 300 illustrated in FIG. 3.

The image scaling processing 700 initially initializes 702 certain register values. The initialization 702 of the register values serves to initialize the hardware so that the outputting of the output image samples and the selection of the coefficient sets are properly aligned with one another at the start of an image scaling process. In particular, the register values being initialized 702 are, for example, the scaling ratio (SR) registers 502 and 504, the initial scaling ratio register 510, the coefficient ratio register 602, and the initial coefficient ratio register 606.

Next, initial image samples being received by the multirate filter 300 are stored 704 to the image sample latches 302–308. In particular, in the embodiment illustrated in FIG. 3, the latches 306, 304 and 302 would respectively receive and hold the first three samples of the input image samples to be scaled. Then, a decision block 706 determines whether an image sample has been received. Here, the image scaling processing 700 awaits a reception of the next image sample. Once the next image sample is received at the latch 302 and the image samples held in latches 306, 304 and 302 respectively shifted to latches 308, 306 and 304, each of the four latches 302–308 contains an image sample value and the image scaling processing 700 continues to process the image sample values held in the latches 302–308.

Next, output sampling indication registers are updated 708. In particular, with respect to FIG. 5, the output sampling indication registers 514 and 520 are updated. The updating 708 of the output sampling indication registers 514 and 520 is preferably performed by the output sampling logic illustrated in FIG. 5. Next, a decision block 710 determines whether the value stored in the output sampling indication register (integer) 520 is greater than zero. If the value stored in the output sampling indication register (integer) 520 is not greater than zero, than an output image sample value is not to be generated at this time and the image scaling processing 700 returns to repeat block 706 and subsequent blocks. When returning to decision block 706, the image scaling processing 700 awaits the reception of the next image sample at the latch 302 and when received causes the sample values stored in the latches 302–306 to shift to the next one of the latches 304–308.

On the other hand, when the value stored in the output sampling indication register (integer) 520 is greater than zero, than an output image sample value is to be produced from the image sample values currently held in the image sample latches 302–308. Hence, to compute the output image sample value, the following blocks 712–716 are carried out. First, the coefficient set selection register is updated 712. For example, with respect to FIG. 6, the coefficient set selection register 610 is updated so as to select an appropriate coefficient set from the coefficient memory 326. Then, the coefficient set is selected 714 in accordance with the value held in the coefficient set selection register 610. In accordance with FIG. 3, the selected coefficient set is retrieved from the coefficient memory 326 in accordance with the control signals 314 being supplied by the controller 312. The selected coefficient set then routes the individual coefficients to the respective multipliers 316, 318, 320 and 322 via the coefficient routing logic 324.

Thereafter, an output image sample computed 716. The computation of the output image sample is obtained from the output of the adder 328 and is formed by the sum of the partial output values generated by the multipliers 316, 318, 320 and 322. The value stored in the output sampling indication register (integer) 520 is then decremented 718 to reflect the fact that an output image sample has been output. The decrementing 718 of the value stored in the output sampling indication register (integer) 520 is achieved by the control signal 522 which selects the minus one (−1) value input to the multiplexer 518 and adds this value to the value from the scaling ratio register via the adder 506. Following block 718, the image scaling processing 700 returns to repeat block 710 and subsequent blocks to continue the image scaling processing 700.

To further illustrate the operation of the multirate filter 300 illustrated in FIG. 3, the following example is provided. In this example, the multirate filter 300 is a 12 tap FIR filter and the scaling ratio (L/M) is 3/4. The input sample values are a series of values referred to as: a, b, c, d, e. The FIR filter has taps/2 unique coefficients which are organized symmetrically so as to provide a linear phase condition. In this example, the coefficients are referred to as: c0, c1, c2, c3, c4 and c5. As illustrated below, although the interpolation operates to effectively insert two zero samples between each adjacent pair of samples, no multiplication operations need be performed for the sample values corresponding to the zeros and thus only a certain set of the coefficients is utilized by the multirate filter 300 to produce an output sample value.

| Clock | c5 | c4 | c3 | c2 | c1 | c0 | c0 | c1 | c2 | c3 | c4 | c5 |
|---|---|---|---|---|---|---|---|---|---|---|---|---|
| 0 | d | 0 | 0 | c | 0 | 0 | b | 0 | 0 | a | 0 | 0 |
| 1 | 0 | d | 0 | 0 | c | 0 | 0 | b | 0 | 0 | a | 0 |
| 2 | 0 | 0 | d | 0 | 0 | c | 0 | 0 | b | 0 | 0 | a |
| 3 | e | 0 | 0 | d | 0 | 0 | c | 0 | 0 | b | 0 | 0 |
| 4 | 0 | e | 0 | 0 | d | 0 | 0 | c | 0 | 0 | b | 0 |
| 5 | 0 | 0 | e | 0 | 0 | d | 0 | 0 | c | 0 | 0 | b |

In the above illustration, data shifts right on each clock. In general, the output sample value of the multirate filter 300 on each clock is the sum of each data sample multiplied by each coefficient. For example, on clock 0, the output sample value ($OUT_0$) produced the multirate filter 300 is as follows.

$$OUT_0 = d(c5) + 0(c4) + 0(c3) + c(c2) + 0(c1) + 0(c0) + b(c0) + 0(c1) + 0(c2) + a(c3) + 0(c4) + 0(c5)$$

However, given that the multirate filter 300 ignores the zero samples, the computation for the series of output sample values (OUT) is as follows.

| Clock | Output Sample Value | Coefficient Set |
|---|---|---|
| 0 | $OUT_0 = d(c5) + c(c2) + b(c0) + a(c3)$ | 0 |
| 1 | $OUT_1 = d(c4) + c(c1) + b(c1) + a(c4)$ | 1 |
| 2 | $OUT_2 = d(c3) + c(c0) + b(c2) + a(c5)$ | 2 |
| 3 | $OUT_3 = e(c5) + d(c2) + c(c0) + b(c3)$ | 0 |
| 4 | $OUT_4 = e(c4) + d(c1) + c(c1) + b(c4)$ | 1 |
| 5 | $OUT_5 = e(c3) + d(c0) + c(c2) + b(c5)$ | 2 |

Note that in this example three output sample values are obtained from each unique series of four input sample values (as requested by the scaling ratio), but a different coefficient set. After the three output sample values are computed, a next input sample value (e) shifts in (see clock 3 in above table) and then in this particular example the coefficient sets repeat again.

From the example above, it can be generally seen that the multirate filter 300 implements the following rules so as to efficiently implement a FIR filter in hardware. If L is the oversampling or interpolation value, N is the number of taps in the FIR filter and X is the number of multiples required for each output sample, then N=LX. Hence, the number of taps for the FIR filter scales with the oversampling or interpolation value L. As a result, the number of taps N can be organized into L sets of X multiplies. The sets are rotated as shown in the example above so that L number of outputs are calculated for each X number of adjacent input sample values. Each of the sets utilizes a different set of X filter coefficients, one for each of the X number of adjacent input sample values.

Given that the multirate filter 300 is a hardware implementation, the number of multipliers X is fixed, but the number of taps N for the FIR filter varies with the oversampling or interpolation value L. Note that the multirate filter 300 illustrated in FIG. 3 includes four (4) multipliers 316, 318, 320 and 322. The filter coefficients are stored locally in the multirate filter 300 in the coefficient memory 326 so that the coefficients can be rapidly accessed. The coefficient memory 326 is however only able to store a finite number of filter coefficients as determined by the design and size of the coefficient memory 326 of the multirate filter 300. Consequently, the maximum upper limit on the oversampling or interpolation value L is determined by the number of filter coefficients stored in the coefficient memory 326. However, due the preferred symmetry of the FIR filter and its coefficients, the number of filter coefficients that need to be stored in the coefficient memory 326 can be reduced by half (i.e., N/2), though doing so makes the routing of the filter coefficients by the coefficient routing logic 324 a bit more difficult. For example, with respect to the multirate filter 300, if the upper limit of the oversampling or interpolation value L were chosen to be 32 and with X fixed at 4 as noted above, then the number of filter coefficients is N, where N=LX=32·4=128. However, if desired, due to symmetry only N/2=64 of the filter coefficients need be stored in the coefficient memory 326.

The number of FIR filter taps thus depends on the oversampling or interpolation value L. As the filter cutoff frequency $f_c$ decreases, the number of filter taps N needs to increase. By fixing the number of multiples at X, an automatic increase in the number of filter taps N results as the filter cutoff frequency $f_c$ decreases. This is illustrated in the following table where X=4.

| L | $f_c = 1/2L$ | N = LX |
|---|---|---|
| 2 | 0.25 | 8 |
| 3 | 0.167 | 12 |
| 4 | 0.125 | 16 |
| 5 | 0.100 | 20 |
| 6 | 0.0833 | 24 |
| * | * | * |
| * | * | * |
| * | * | * |
| 30 | 0.01667 | 120 |
| 31 | 0.0161 | 124 |
| 32 | 0.0156 | 128 |

Earlier, it was pointed out that the amplitude of the input data samples needs to be multiplied by L to raise the energy level in the interpolated sample stream. This multiplication can be done by pre-multiplying each filter coefficient in the FIR filter by L, so this does not have to be done in hardware. In the example, coefficients c0, c1, ... c5 become Lc0, Lc1, Lc2 ... Lc5. All of the coefficients of an FIR filter (before pre-multiplication) sum to unity, so the greater the number of coefficients, the smaller their values and the more bits are required to represent them. The second advantage of pre-multiplying the coefficients by L is that the number of bits required to store the coefficients does not change much for different numbers of taps. Pre-multiplying by L keeps the width of the coefficients and arithmetic hardware fairly constant.

So far the operation of the multirate filter 300 has been discussed with respect to the interpolation portion. For example, the above examples of the computation of the output sample values would be accurate for the scaling ratio (L/M) of 3/1. However, the multirate filter 300 further includes a decimation portion that depends on the decimation value M. Hence, when the decimation value M is an integer greater the 1, the decimation portion of the multirate filter operates to undersample the output sample values being produced. Accordingly, the multirate filter 300 only computes those of the output sample values that are to be output from the decimation portion. The following table illustrates the impact of the decimation portion on the operation of the multirate filter 300 in the computation of the series of output sample values (OUT) when the scaling ratio (L/M) is 3/4.

| Clock Output Sample Value | Coefficient Set | Action |
|---|---|---|
| 0 | $OUT_0 = d(c5) + c(c2) + b(c0) + a(c3)$ | 0 | output value |
| 1 | $OUT_1 = d(c4) + c(c1) + b(c1) + a(c4)$ | 1 | drop value |
| 2 | $OUT_2 = d(c3) + c(c0) + b(c2) + a(c5)$ | 2 | drop value |
| 3 | $OUT_3 = e(c5) + d(c2) + c(c0) + b(c3)$ | 0 | drop value |
| 4 | $OUT_4 = e(c4) + d(c1) + c(c1) + b(c4)$ | 1 | output value |
| 5 | $OUT_5 = e(c3) + d(c0) + c(c2) + b(c5)$ | 2 | drop value |
| 6 | $OUT_6 = f(c5) + e(c2) + d(c0) + c(c3)$ | 0 | drop value |
| 7 | $OUT_7 = f(c4) + e(c1) + d(c1) + c(c4)$ | 1 | drop value |
| 8 | $OUT_8 = f(c3) + e(c0) + d(c2) + c(c5)$ | 2 | output value |
| 9 | $OUT_9 = g(c5) + f(c2) + e(c0) + d(c3)$ | 0 | drop value |
| 10 | $OUT_{10} = g(c4) + f(c1) + e(c1) + d(c4)$ | 1 | drop value |
| 11 | $OUT_{11} = g(c3) + f(c0) + e(c2) + d(c5)$ | 2 | drop value |
| 12 | $OUT_{12} = h(c5) + g(c2) + f(c0) + e(c3)$ | 0 | output value |

As shown in the above table, the multirate filter 300 only needs to compute those of the output sample values that are actually to be output by the multirate filter 300. As such the computations in the above table that are unneeded are not performed, The result being that the multirate filter only performs the computation indicated in the following table that reflects a substantial reduction in computation.

| Clock Output Sample Value | Coefficient Set | Action |
|---|---|---|
| 0 | $OUT_0 = d(c5) + c(c2) + b(c0) + a(c3)$ | 0 | output value |
| 1 | $OUT_1 = e(c4) + d(c1) + c(c1) + b(c4)$ | 1 | output value |
| 2 | $OUT_2 = f(c3) + e(c0) + d(c2) + c(c5)$ | 2 | output value |
| 3 | $OUT_3 = h(c5) + g(c2) + f(c0) + e(c3)$ | 0 | output value |
| . | . | . | . |
| . | . | . | . |
| . | . | . | . |

By operating in this manner a multirate filter according to the invention provides for a fast, efficient hardware-based implementation of a multirate filter based on a FIR filter. In general, the characteristics of the multirate filter according to the invention are as follows. The interpolation and decimation FIR filter operations are combined into one FIR filter. Zeros that are inserted as part of the interpolation processing are ignored. The filter coefficients for the FIR filter are pre-multiplied by L to compensate for the interpolation processing. The scaling ratio (L/M) is a ratio of integers. The number of multiples, X, is held constant so that the number of multiples done per output sample is fixed and thus a fixed number of multiplier circuits can be implemented in hardware. The number of filter taps N scales with L, so that N=LX. The filter coefficients are organized into L sets, with each set containing X number of coefficients. A new set of filter coefficient is selected for each output sample value being output from the multirate filter as only the output sample values that are actually output are calculated. Accordingly, with the scaling ratio (L/M) and an input sample rate ($f_s$), then the output sample rate ($f_{out}$) is equal to $f_s \cdot L/M$.

The sample rate conversion (scaling) technique according to the invention uses a digital FIR filter. A known characteristic of FIR filters is that they have a linear phase characteristic, meaning that the delay through the filter is the same for all frequencies. Consequently, the inventive technique does not introduce any significant phase errors, provided the coefficients utilized by the FIR filter are symmetrical.

A FIR filter assumes that all samples beyond a finite number are zero and thus do not affect the filtering. In effect, the filtering is then not ideal and some unwanted energy passes through. This is also known as "windowing" the data with a rectangular or other shape window. By using different types of windows, the characteristics of the FIR filter can be smoothed out or somewhat enhanced. As an example, instead of using a rectangular window, one could use a Hamming window.

The equation for calculating the filter coefficients (for a positive symmetry, even taps type FIR filter) with a Hamming window is:

For j=1 to m, $$\text{coefficient}[j] = \frac{2f_c \text{Sin}[wc(j-1/2)]}{wc(j-1/2)} * \{(0.54 + (0.46\text{Cos}[(2Pi(j-1/2)/\text{taps}])\}$$

where wc=2 Pi $f_c$. Note that the part within the brackets ({ }) is the window function for a Hamming window. If a rectangular window were instead used, then the contents within the brackets is simply "1". The first ten coefficients produced by the above equation are given in the following table.

| | |
|---|---|
| coefficient [1] | 0.447609 |
| coefficient [2] | 0.14253 |
| coefficient [3] | −0.0779016 |
| coefficient [4] | −0.0481564 |
| coefficient [5] | 0.0306087 |
| coefficient [6] | 0.0191538 |
| coefficient [7] | −0.0114674 |
| coefficient [8] | −0.00644419 |
| coefficient [9] | 0.00344601 |
| coefficient [10] | 0.00202958 |

In any case, the filter coefficients are programmable so that any technique or filter construction could be utilized.

The sample rate conversion or scaling provided by the invention operates in one or more dimensions. In the case of video and graphical images, horizontal and vertical scaling are able to be independently performed using the invention. For example, in one embodiment, the multirate filter 300 illustrated in FIG. 3 can first scale an image in a vertical direction, and then the same multirate filter 300 can scale the image in a horizontal direction. However, for performance reasons, it is probably preferable for a hardware implementation to include a multirate filter for vertical scaling and a separate multirate filter for horizontal scaling. The multirate filter could have slightly different designs if different quality levels are acceptable. For example, a multirate filter for horizontal scaling might be implemented with six (6) multipliers and a multirate filter for vertical scaling might be implemented with four (4) multipliers for a lesser quality level at reduced hardware resources Furthermore, given that the coefficient memory 326 has a finite size, there is a maximum number of taps that the FIR filter may have. As a result, the interpolation value L has a maximum value. In the case of the multirate filter in FIG. 3, the maximum interpolation value L is 32, and thus the sample values computed by the multirate filter can be on a 32 times finer grid than the input samples. However, in cases where the interpolation value L is greater than 32, prescaling can be used to effectively handle the larger interpolation values. Another limit occurs when scaling down, namely 0.5<L/M<1; hence, when L/M<0.5, a separate fixed FIR filter to pre-scale by 1/2 can be used one or more times until the L/M requested is no longer less than 0.5. Also in the case of vertical scaling, temporary memory storage (e.g., line memory) is needed for holding the output samples until needed by a horizontal raster scan mechanism, and the size of the temporary storage can also limit the maximum interpolation value L for vertical scaling.

In the case where in the input samples are 8 bits, register sizes of the controller 312 of the multirate filter 300 are approximately 4 bits for integer storage and 12 bits for the other registers. Also, the coefficients storage in the coefficient memory 326 are approximately 10–12 bits.

The advantages of the invention are numerous. One advantage of the invention is that very minimal high frequency or phase errors are introduced by the sample rate conversion (scaling) technique utilized by the invention. Since the sample rate conversion technique utilizes a multirate FIR filter approach, the needed sample values (i.e., pixels) are calculated with a high degree of accuracy so as to minimize any phase errors and likewise reducing the introduction of undesirable high frequencies. Hence, the accuracy of the calculations for the needed data samples are calculated with significantly greater accuracy than even the linear interpolator approach that has been conventionally used. Another advantage of the invention is that the basic technique is scaleable in accordance with the amount of hardware resources made available for providing the scaling function. Yet another advantage of the invention is that the sample rate conversion (scaling) technique according to the invention can use different quality settings for horizontal and vertical scaling directions. Still another advantage of the invention is that the invention is applicable to sampled data generally, including video images, graphical images, audio streams, and the like.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An apparatus for performing sample rate conversion, said apparatus comprising:

a plurality of storage devices arranged in a serial chain, said storage devices being capable of storing an input sample value for a series of samples, the series of samples being sequentially shifted through each of said storage devices in the serial chain in accordance with a clock signal;

a coefficient memory storage for storing a plurality of coefficient sets, each of the coefficient sets includes a plurality of coefficient values;

a plurality of multipliers, each of the multipliers being associated with one of said storage devices, each of said multipliers operates to multiply the respective sample value stored in the respective one of said storage devices with a respective coefficient value of one of the coefficient sets to produce a partial output value;

an adder for adding the partial output values from each of said multipliers to produce an output sample value; and a controller for producing the clock signal used to receive the input sample values in said storage devices and for selecting one of the coefficient sets from said coefficient memory storage to supply to said multipliers for the producing of each of the partial output values, said controller produces a coefficient set selection value that selects the one of the coefficient sets from said coefficient memory storage, wherein to select a next one of the coefficient sets, said controller includes an adder that adds the coefficient set selection value used to select the present one of the coefficient sets with a coefficient ratio value.

2. An apparatus as recited in claim 1, wherein the coefficient values stored in said coefficient memory storage are pre-multiplied by an interpolation value.

3. An apparatus as recited in claim 1, wherein said multipliers and the coefficient values implement a FIR filter, and wherein said controller operates to control the FIR filter to produce the output sample values needed based on a scaling ratio.

4. An apparatus as recited in claim 1, wherein the input sample values have an input sample rate, and the output sample values are produced in accordance with an output sample rate that differs from the input sample rate by a predetermined scaling ratio.

5. An apparatus as recited in claim 4, wherein said controller operates to control the production of the partial output values based on the scaling ratio, and wherein the coefficient ratio value is the inverse of the scaling ratio.

6. An apparatus as recited in claim 4, wherein the scaling ratio is a ratio of integers (L/M), and the coefficient values stored in coefficient memory storage are pre-multiplied by L.

7. An apparatus as recited in claim 6, wherein the input sample values pertain to an image having an initial size, and said apparatus operates to scale the image from the initial size to a reformatted size.

8. An apparatus as recited in claim 7, wherein the image is a video image.

9. An apparatus as recited in claim 6, wherein the input sample values pertain to a stream of audio data having a first streaming rate, and said apparatus operates to compress or decompress the stream of audio data from the first streaming rate to a second streaming rate.

10. An apparatus as recited in claim 1, wherein said apparatus performs image scaling in one dimension.

11. An apparatus as recited in claim 1, wherein the input sample values pertain to an image having an initial size, and said apparatus operates to scale the image from the initial size to a reformatted size.

12. An apparatus as recited in claim 1, wherein the image is a video image.

13. An apparatus as recited in claim 1, wherein the input sample values pertain to a stream of audio data having a first streaming rate, and said apparatus operates to compression or expansion of the stream of audio data from the first streaming rate to a second streaming rate.

14. A sample rate conversion apparatus for scaling input sampled data in accordance with a scaling ratio L/M, where L and M are integers, said apparatus comprising:

a FIR filter including a fixed number (X) of multipliers, said FIR filter effectively implements a FIR filter having N filter taps, where the number of filter taps N=LX, said FIR filter operates on the input sampled data in accordance with the scaling ratio L/M to produce output sampled data;

a coefficient storage device for storing a plurality of coefficient sets, each of the coefficient sets having a filter coefficient for each of said X multipliers;

a coefficient set selector that selects an appropriate one of the coefficient sets from said coefficient storage device in accordance with a coefficient set selection value; and an adder that adds the coefficient set selection value with a coefficient ratio value to select a next one of the coefficient sets.

15. A sample rate conversion apparatus as recited in claim 14, wherein said filter coefficients are pre-multiplied by L, and wherein the coefficient set selected for obtaining the output sampled data periodically repeats, though changing for each of output sampled value of the output sampled data.

16. A sample rate conversion apparatus as recited in claim 14, wherein said FIR filter receives the input sampled data at an input sample rate $f_{in}$, and the output sampled data is produced at an output sample rate $f_{out}$, where $f_{out}=f_{in} \cdot L/M$.

17. A sample rate conversion apparatus as recited in claim 14, wherein the input sample values pertain to an image having an initial size, and said apparatus operates to scale the image from the initial size to a reformatted size.

18. A sample rate conversion apparatus as recited in claim 17, wherein the image is a video image.

19. A sample rate conversion apparatus as recited in claim 14, wherein the input sample values pertain to a stream of audio data having a first streaming rate, and said apparatus operates to compression or expansion of the stream of audio data from the first streaming rate to a second streaming rate.

20. A method for scaling an image to a larger size or a smaller size, said method comprising:

(a) receiving a sequence of a predetermined number of input samples for an image;

(b) receiving a scaling ratio, the scaling ratio being a ratio of integers L/M;

(c) determining an output sampling rate based on the scaling ratio;

(d) determining a series of coefficient sets having the predetermined number of coefficients, where the coefficients have been pre-multiplied by L;

(e) supplying the coefficients of a selected one of one of the coefficient sets to the predetermined number of multipliers, the selected one of the coefficient sets being chosen by a coefficient set selection value;

(f) multiplying the respective coefficients and input samples to produce the predetermined number of partial output values;

(g) summing the predetermined number of the partial output values to determine an output sample value;

(h) receiving a next input sample for the image and modifying the sequence of the input samples to add the next input sample and drop an oldest one of the input samples;

(i) adding a coefficient ratio value to the coefficient set selection value to update the coefficient set selection value to select another one of the coefficient sets; and (j) repeating (e)–(i) after the next input sample is received and the coefficient set selection value is updated.

* * * * *